US008492869B2

(12) United States Patent
Farooq et al.

(10) Patent No.: US 8,492,869 B2
(45) Date of Patent: Jul. 23, 2013

(54) 3D INTEGRATED CIRCUIT DEVICE HAVING LOWER-COST ACTIVE CIRCUITRY LAYERS STACKED BEFORE HIGHER-COST ACTIVE CIRCUITRY LAYER

(75) Inventors: Mukta G. Farooq, Hopewell Junction, NY (US); Robert Hannon, Wappingers Falls, NY (US); Subramanian S. Iyer, Mount Kisco, NY (US); Steven J. Koester, Ossining, NY (US); Fei Liu, Mount Kisco, NY (US); Sampath Purushothaman, Yorktown Heights, NY (US); Albert M. Young, Fishkill, NY (US); Roy R. Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/571,920

(22) Filed: Aug. 10, 2012

(65) Prior Publication Data

US 2012/0299200 A1 Nov. 29, 2012

Related U.S. Application Data

(62) Division of application No. 12/194,211, filed on Aug. 19, 2008, now Pat. No. 8,399,336.

(51) Int. Cl.
*H01L 21/50* (2006.01)
(52) U.S. Cl.
USPC ............. 257/506; 257/E21.088; 257/E21.508
(58) Field of Classification Search
USPC ........................ 257/506, E21.088, E21.508
See application file for complete search history.

(56) References Cited

U.S. PATENT DOCUMENTS

| | | | |
|---|---|---|---|
| 5,373,184 A | 12/1994 | Moslehi | |
| 5,426,072 A | 6/1995 | Finnila | |
| 5,844,839 A | 12/1998 | Smayling et al. | |
| 5,915,167 A | 6/1999 | Leedy | ............................ 438/108 |
| 5,937,312 A | 8/1999 | Iyer et al. | |
| 6,130,422 A | 10/2000 | Bawolek et al. | |
| 6,762,076 B2 | 7/2004 | Kim et al. | |
| 7,151,009 B2 | 12/2006 | Kim et al. | |
| 7,566,632 B1 | 7/2009 | Rothwell et al. | |
| 7,834,450 B2 | 11/2010 | Kang | ............................ 257/724 |
| 2003/0036256 A1 | 2/2003 | Efland et al. | |
| 2005/0121711 A1 | 6/2005 | Pogge et al. | |
| 2006/0057836 A1 | 3/2006 | Nagarajan et al. | |
| 2007/0111386 A1 | 5/2007 | Kim et al. | |
| 2007/0287224 A1 | 12/2007 | Alam et al. | |
| 2008/0185103 A1 | 8/2008 | Bornstein et al. | |
| 2010/0044826 A1 | 2/2010 | Farooq | |
| 2010/0047964 A1 | 2/2010 | Farooq | |

OTHER PUBLICATIONS

Non-Final Office Action dated May 4, 2011 for U.S. Appl. No. 12/194,065.
International Search Report and Written Opinion dated Sep. 25, 2009 for PCT/US09/54333.

*Primary Examiner* — Andy Huynh
(74) *Attorney, Agent, or Firm* — Stephen Bongini; Fleit Gibbons Gutman Bongini & Bianco PL

(57) ABSTRACT

A 3D integrated circuit structure is provided. The 3D integrated circuit structure includes an interface wafer including a first wiring layer, a first active circuitry layer including active circuitry, and a wafer including active circuitry. The first active circuitry layer is bonded face down to the interface wafer, and the wafer is bonded face down to the first active circuitry layer. The first active circuitry layer is lower-cost than the wafer.

20 Claims, 8 Drawing Sheets

3D INTEGRATED CIRCUIT DEVICE HAVING LOWER-COST ACTIVE CIRCUITRY LAYERS STACKED BEFORE HIGHER-COST ACTIVE CIRCUITRY LAYER

CROSS REFERENCE TO RELATED APPLICATIONS

This application is a divisional of prior U.S. application Ser. No. 12/194,211, filed Aug. 19, 2008, now U.S. Pat. No. 8,399,336. The entire disclosure of U.S. application Ser. No. 12/194,211 is herein incorporated by reference.

Additionally, this application is related to application "3D Integrated Circuit Device Fabrication With Precisely Controllable Substrate Removal," Ser. No. 12/194,065, now U.S. Pat. No. 8,129,256, and application "3D Integrated Circuit Device Fabrication Using Interface Wafer As Permanent Carrier," Ser. No. 12/194,198, now U.S. Pat. No. U.S. Pat. No. 8,298,914. These related applications are incorporated herein by reference in their entirety.

This invention was made with Government support under Contract No.: N66001-04-C-8032 awarded by Defense Advanced Research Projects Agency (DARPA). The Government has certain rights in this invention.

FIELD OF THE INVENTION

The present invention generally relates to the field of integrated circuits, and more particularly relates to the fabrication of three-dimensional (3D) integrated circuit devices.

BACKGROUND OF THE INVENTION

Three-dimensional (3D) integrated circuit devices are experiencing extremely active development in the industry. One problem experienced in the fabrication of 3D integrated circuit devices is that general purpose substrate thinning techniques do not allow the final substrate to be produced with a controlled thickness that is thin enough to allow high-density through-silicon vias with reasonable aspect ratios to be realized. One known technique for overcoming this problem is utilizing a buried oxide layer (BOX) as the etch stop. However, this technique only works for silicon-on-insulator (SOI) wafers. Further, even with an SOI wafer, this technique does not work for SOI circuits having structures that extend below the buried oxide, such as an embedded DRAM (e-DRAM) trench.

Another known technique for overcoming this problem is utilizing a double buried oxide layer (double-BOX) structure. However, this technique greatly increases the manufacturing cost. Further, like the single buried oxide layer structure solution, the double-BOX technique requires protection of the substrate from the other wafer. Such protection is required because, while the SOI wafer acts as an etch stop, it does not provide selectivity between the different substrates.

Yet another known technique for overcoming this problem is to not use an etch stop but to perform "blind" thinning. However, this technique does not allow the wafers to be thinned aggressively and creates uniformity problems. Further, for integrated circuits that require a high density of 3D vias, this technique also forces the use of high aspect ratio vias that cannot be filled with copper. Instead, tungsten has to be used for the vias, which has three times higher resistivity than copper.

Another problem experienced in the fabrication of 3D integrated circuit devices is that stacking three or more layers to create a multi-layer stack leads to yield loss. One technique that attempts to overcome this problem is to stack layers through bonding to temporary handle wafers. However, the use of such a temporary handle wafer (e.g., a glass wafer) induces overlay distortions that degrade the alignment overlay between the wafers. That is, this technique does not allow high-precision optical alignment in subsequent lithographic steps. Without high-precision optical alignment, the via density is degraded and large capture pads with high parasitic capacitances must be used. Further, the use of such bonding to temporary handle wafers does allow flexibility in the way the wafers are stacked.

Another technique that attempts to overcome this problem is to simply use a direct face-to-face joining of the wafers. However, such direct face-to-face joining is problematic because the bottom wafer (which usually is a logic wafer) must then be used as the handle wafer throughout the stacking process. While this may be acceptable in the fabrication of a two layer stack, for a multi-layer (i.e., three or more layer) stack this means that the logic wafer must go through many bonding and thinning steps. This increases the probability of catastrophic failure and loss of the entire integrated circuit, including the logic wafer that is often the most expensive wafer in the stack.

SUMMARY OF THE INVENTION

One embodiment of the present invention provides a method for fabricating a 3D integrated circuit structure. According to the method, a first active circuitry layer wafer that includes active circuitry is provided, and a first portion of the first active circuitry layer wafer is removed such that a second portion of the first active circuitry layer wafer remains. Another wafer that includes active circuitry is provided, and the other wafer is bonded to the second portion of the first active circuitry layer wafer. The first active circuitry layer wafer is lower-cost than the other wafer.

Another embodiment of the present invention provides a 3D integrated circuit structure that includes an interface wafer including a first wiring layer, a first active circuitry layer including active circuitry, and a wafer including active circuitry. The first active circuitry layer is bonded face down to the interface wafer, and the wafer is bonded face down to the first active circuitry layer. The first active circuitry layer is lower-cost than the wafer.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION

Preferred embodiments of the present invention will be described in detail hereinbelow with reference to the attached drawings.

Embodiments of the present invention improve manufacturing yield by stacking lower-cost active circuitry layers of a 3D integrated circuit device before one or more higher-cost active circuitry layers. Lower-cost active circuitry layers are less expensive to manufacture than higher-cost active circuitry layers. In one exemplary embodiment, multiple memory layers of a 3D integrated circuit device are integrated with a logic layer. All of the memory layers are stacked first, and the logic layer is added to the stack last. Because the lower-cost memory layers are stacked before the higher-cost logic layer, the risk of damage to the logic layer during assembly is reduced. Thus, the present invention improves yield for 3D integrated circuit devices, and lowers manufacturing cost.

Figure 1:
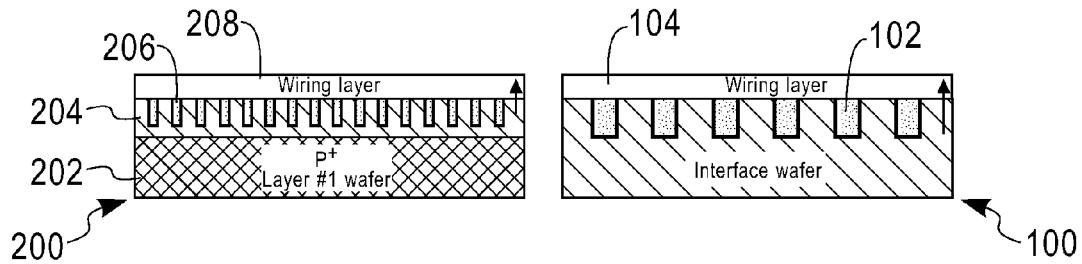
FIGS. 1 to 11 are cross-sectional views of a process for fabricating a three-dimensional integrated circuit device according to one embodiment of the present invention.

FIGS. 1 to 11 illustrate a process for fabricating a three-dimensional integrated circuit device according to one embodiment of the present invention. As shown in FIG. 1, the process starts with an interface wafer 100, which will be the interface between the stacked active circuitry layers and a package in the completed integrated circuit. In particular, the exposed surface of the interface wafer 100 will carry the C4 (controlled collapse chip connection) solder bumps in the completed integrated circuit. These C4 (or flip-chip) solder bumps are used to attach the integrated circuit to the package (e.g., a resin or ceramic module). The interface wafer 100 is a substrate made of a material that is not soluble in the etchants that are utilized in the subsequent substrate removal steps (i.e., a material that is not soluble in etchants that selectively etch P+ layers with respect to P− layers).

In this embodiment, the interface wafer is not formed from a P+ substrate, so it is impervious to the etching that removes the substrates of the wafers of the active circuitry layers of the stack. The interface wafer 100 is a silicon substrate that has through-silicon vias 102 at the same pitch as the package. Further, in this embodiment, the through-silicon vias are filled with tungsten metal. In further embodiments, the through-silicon vias are filled with other metallurgies, such as copper. The through-silicon vias of the interface wafer 100 do not need to be made of the same material as the through-silicon vias in the other layers of the stack. The interface wafer 100 also has a wiring layer 104 that distributes signals and power to the stacked layers of the integrated circuit. In this embodiment, the interface wafer 100 is transparent to infrared radiation.

Additionally, a first active circuitry layer wafer 200 is provided. The first active circuitry layer wafer 200 is formed with a P+/P− silicon substrate, which is a P+ wafer 202 that has a P− top active circuitry layer 204. In this embodiment, the P− top active circuitry layer 204 is grown epitaxially on a P+ wafer and has a thickness of between about 5 and 20 microns. Further, in this embodiment the P+ wafer is a boron-doped wafer with a doping concentration in the range of about $1 \times 10^{18}$ cm-$^3$ to $3 \times 10^{20}$ cm-$^3$, and the P− epitaxial layer has a doping concentration of less than about $1 \times 10^{18}$ cm-$^3$. In further embodiments, the P− epitaxial layer is not-intentionally-doped, or doped N-type with a concentration of less than about $1 \times 10^{18}$ cm-$^3$.

Through-silicon vias 206 are etched into the P− top active circuitry layer 204 so as to end near the P+ wafer 202. In further embodiments, the vias 206 pass through the surface of the P+ wafer 202. Active circuitry (i.e., active components such as transistors) and one or more wiring levels 208 are formed at the top surface of the first active circuitry layer wafer 200.

Figure 2:
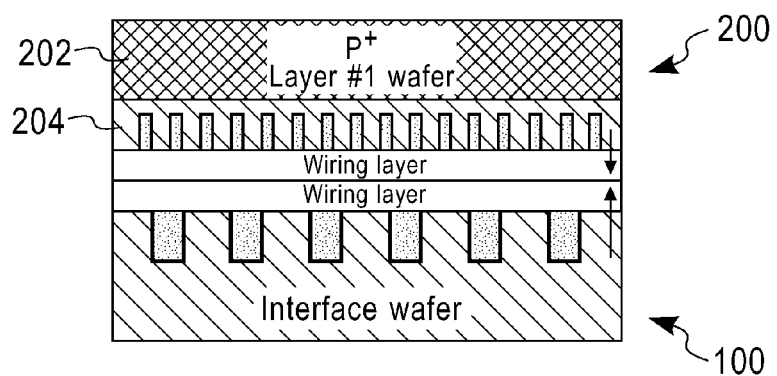

Next, as shown in FIG. 2, the first active circuitry layer wafer 200 is aligned face down to the interface wafer 100. This face-to-face alignment using two silicon wafers allows for higher-precision alignment compared to the case where one of the wafers utilizes a temporary handle wafer (e.g., of glass). The first active circuitry layer wafer 200 is bonded to the interface wafer 100, so that the interface wafer functions as the permanent carrier for the first active circuitry layer. In this embodiment, copper-copper or a combination of copper-copper and adhesive bonding (e.g., using a polymer adhesive) is utilized. In further embodiments, other metallurgies (such as a copper alloy or a nickel-gold alloy) are utilized.

Figure 3:
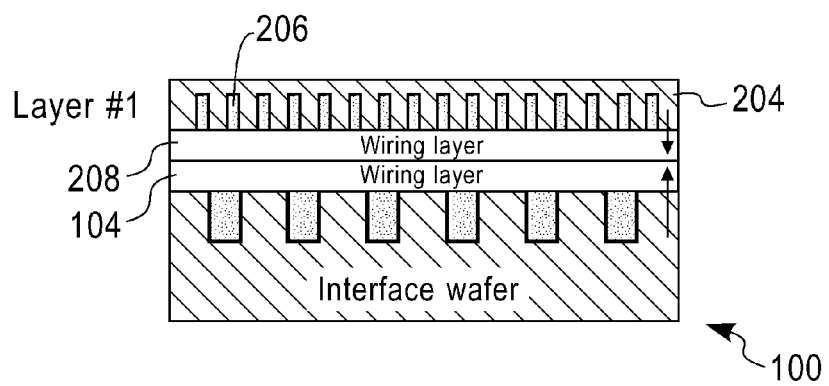

The P+ layer 202 of the first active circuitry layer wafer 200 is then selectively removed, as shown in FIG. 3. In this embodiment, a series of non-selective substrate thinning processes are first utilized (e.g., wafer grinding and polishing), and then wet chemical etching is utilized to remove the remaining P+ layer 202 selectively with respect to the P− layer 204. The final removal of the P+ layer 202 of the first active circuitry layer wafer 200 is performed using a selective etchant, such as HNA (hydrofluoric acid/nitric acid/acetic acid). Because the bulk of the interface wafer 100 is not soluble in this selective etchant, the process is very robust. Additionally, in this embodiment the interface wafer 100 is made from a lightly doped N− or P− silicon in order to allow infrared (IR) alignment to be performed. In other embodiments, the interface wafer 100 is also a P+ silicon substrate.

This selective removal of the P+ layer does not substantially affect the P− epitaxial layer 204, the active circuitry and wiring levels 104 and 208, or the interface wafer 100 that remain. Thus, the use of the P+/P− substrate allows the P+ layer to be selectively removed, so that the wafer is controllably thinned to the thickness of the P− layer, which can be made very thin (e.g., about 5-20 microns thick).

Figure 4:
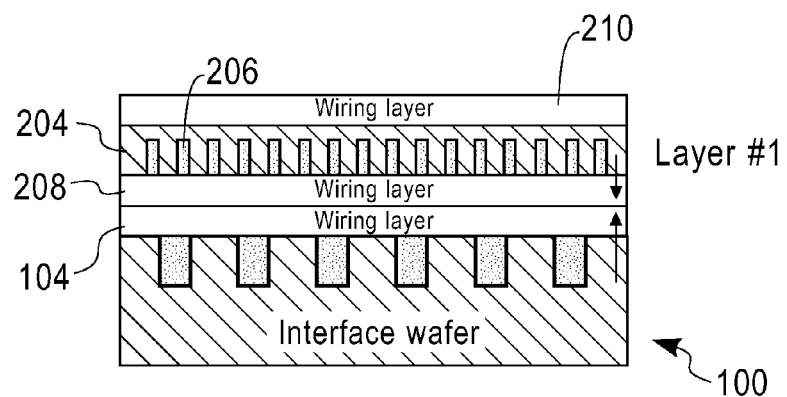

Next, in this embodiment, an etch back (e.g., using reactive ion etching) is performed in order to expose the top portions of the vias 206 in the P− layer 204. In other embodiments in which the vias 206 pass into the P+ layer 202, such an etch is not needed as the top portions of the vias are already exposed after the selective removal of the P+ layer. A wiring layer 210 having insulation and one or more back end of line (BEOL) metallization layers coupled to the vias 206 is then patterned onto the backside of the P− layer 204, as shown in FIG. 4. In this embodiment, each metallization layer of the wiring layer 210 is formed by depositing a dielectric layer, etching the dielectric layer, and depositing metal in the etched areas.

These steps are then repeated any number of times to create a multi-layer stack on the interface wafer 100, with the interface wafer functioning as the permanent carrier for this stack. When repeating these steps to create the multi-layer stack on the interface wafer, embodiments of the present invention stack lower-cost active circuitry layers before one or more higher-cost active circuitry layers. For example, in one embodiment the 3D integrated circuit device includes multiple memory layers comprising embedded DRAM, and a logic layer comprising a microprocessor core. The memory layers are less expensive to manufacture than the logic layer with its microprocessor core (e.g., due to a relatively higher-yield of the memory layers). If the logic layer was stacked first and then the memory layers were all stacked on top of the logic layer, then the more expensive logic layer would be lost if any catastrophic failure occurred during the assembly of the stack. Therefore, in accordance with the present invention, all of the memory layers are stacked first, and the logic layer with its microprocessor core is added to the stack last. Because the lower-cost memory layers are stacked before the higher-cost logic layer, the risk of damage to the more expensive logic layer is reduced.

Figure 5:
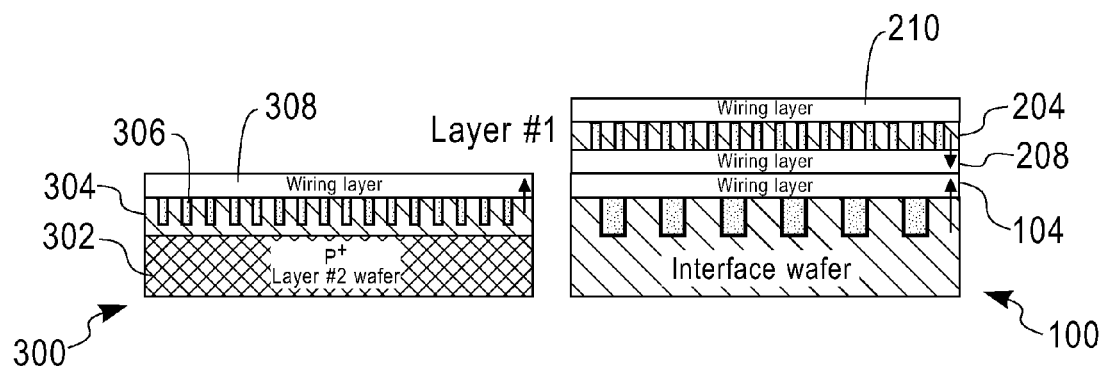

In the exemplary embodiment that is illustrated, the steps described above are repeated once more to create a second active circuitry layer. More specifically, a second active circuitry layer wafer 300 is provided, as shown in FIG. 5. The second active circuitry layer wafer 300 is also formed with a P+/P− silicon substrate, which is a P+ wafer 302 that has a P− top active circuitry layer 304. In this embodiment, the P− top active circuitry layer 304 is grown epitaxially and has a thickness of between about 5 and 20 microns. Through-silicon vias 306 are etched into the P− top active circuitry layer 304 so as to end near the P+ wafer 302, and active circuitry and one or more wiring levels 308 are formed at the top surface of the second active circuitry layer wafer 300.

Figure 6:
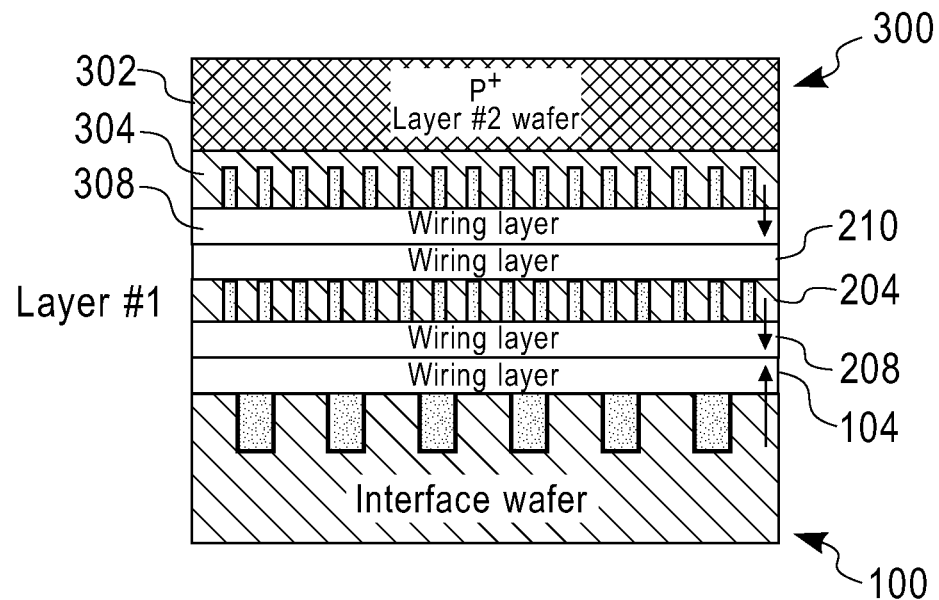

Next, as shown in FIG. 6, the second active circuitry layer wafer 300 is aligned face down to the wiring layer 210 on the first P− layer 204 attached to the interface wafer 100. This face-to-face alignment using two silicon wafers allows for higher-precision alignment compared to the case where one of the wafers utilizes a temporary handle wafer (e.g., of glass). The second active circuitry layer wafer 300 is bonded to the wiring layer 210 using copper-copper or a combination of copper-copper and adhesive bonding, so that the interface wafer functions as the permanent carrier for the first and second active circuitry layers. In further embodiments, other metallurgies (such as a copper alloy or a nickel-gold alloy) are utilized.

Figure 7:
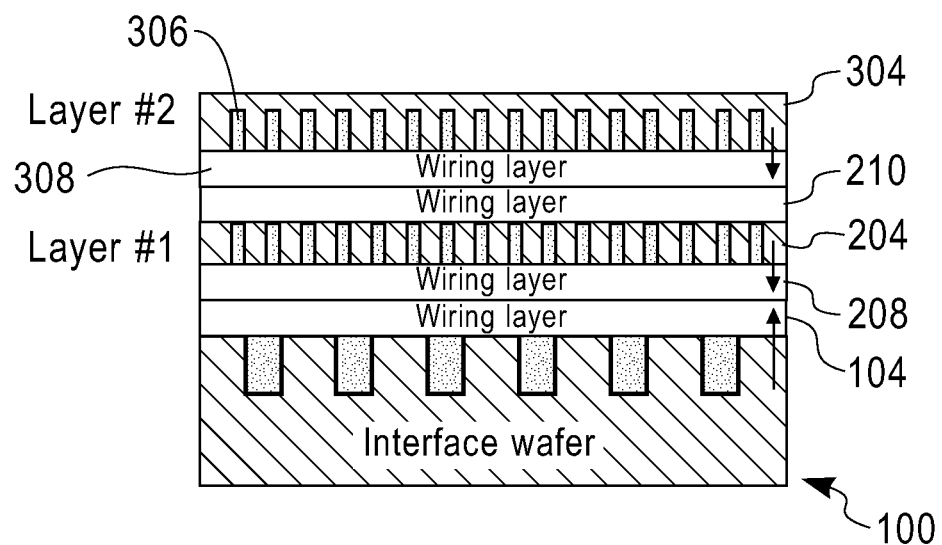

The P+ layer 302 of the second active circuitry layer wafer 300 is then selectively removed, as shown in FIG. 7. In this embodiment, a series of non-selective substrate thinning processes are first utilized (e.g., wafer grinding and polishing), and then a wet chemical etching is utilized to remove the remaining P+ layer 302 of the second active circuitry layer wafer 300 selectively with respect to the P− layer 304 of the second active circuitry layer wafer 300. This selective removal of the P+ layer 302 of the second active circuitry layer wafer 300 does not substantially affect the P− layers 204 and 304, the active circuitry and wiring levels 104, 208, 210, and 308, or the interface wafer 100 that remain. Thus, the interface wafer 100 is robust against multiple substrate removal etches for removing the P+ layers of all of the active circuitry layer wafers that are used to create the multi-layer stack.

Figure 8:
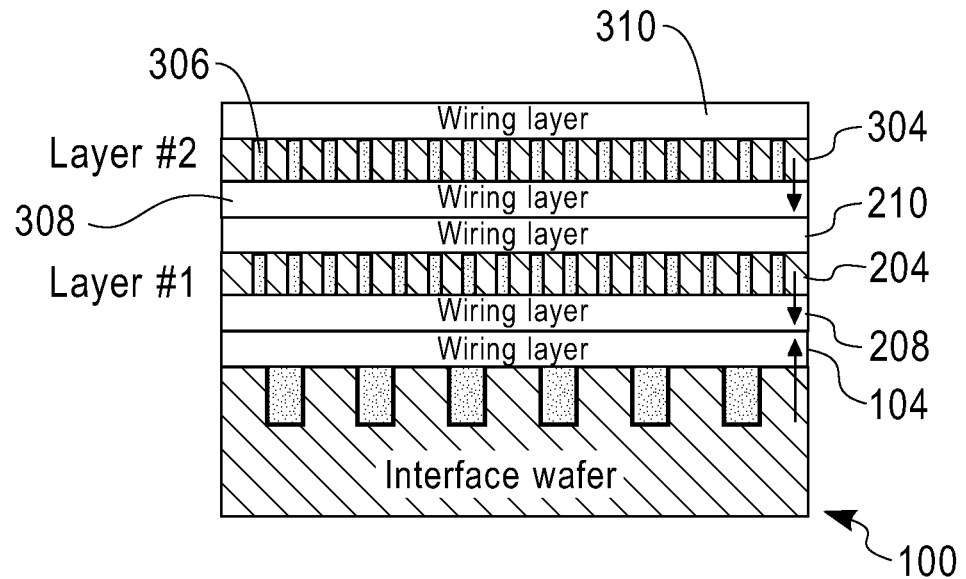

An etch back is then performed in order to expose the top portions of the vias 306 in the second P− layer 304. A wiring layer 310 having insulation and one or more BEOL metallization layers coupled to the vias 306 is then patterned onto the backside of the second P− layer 304, as shown in FIG. 8.

Figure 9:
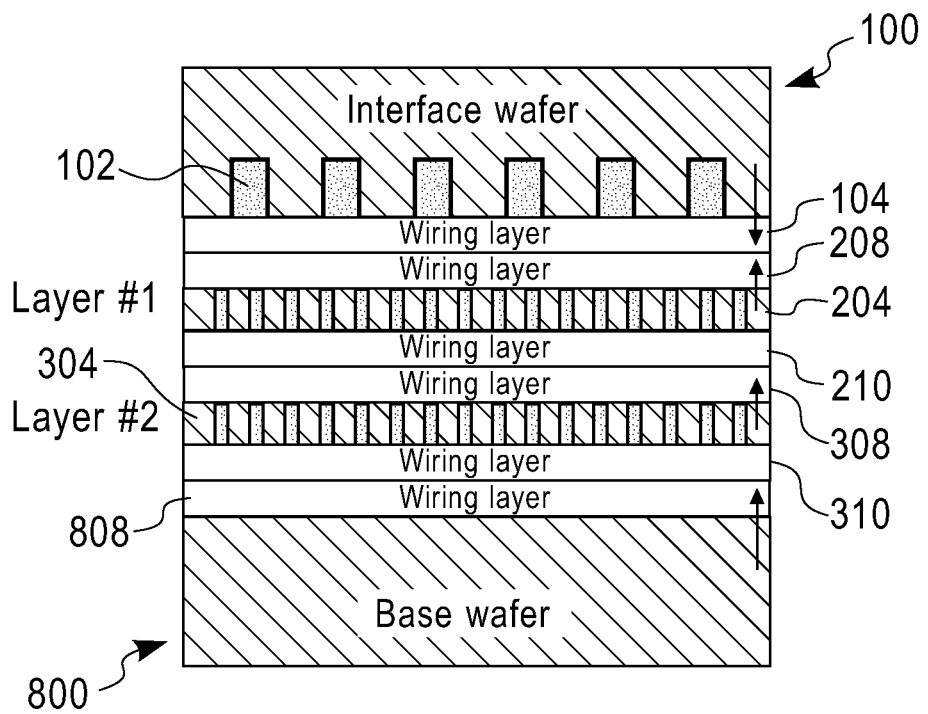

After the desired number of active circuitry layers are bonded together in this manner with the interface wafer functioning as the permanent carrier for the stack of active circuitry layers, the resulting structure is attached to a base wafer 800, as shown in FIG. 9. The base wafer 800 of this embodiment is made of bulk silicon or SOI and is topped by a wiring layer 808 having insulation and one or more BEOL metallization layers. In this embodiment, the base wafer 800 does not have through-silicon vias. In some embodiments, the base wafer includes active circuitry (e.g., transistors) and/or passive circuit elements (e.g., resistors and capacitors). With the interface wafer 100 functioning as the permanent carrier for the stack, the interface wafer and the stack of active circuitry layers attached to it are aligned face down to the base wafer. Thus, because they have been "flipped" twice in this embodiment, all of the active circuitry layers that were previously stacked on the interface wafer 100 are now face up with respect to the base wafer 800, as shown by the arrows in FIG. 9.

Figure 10:
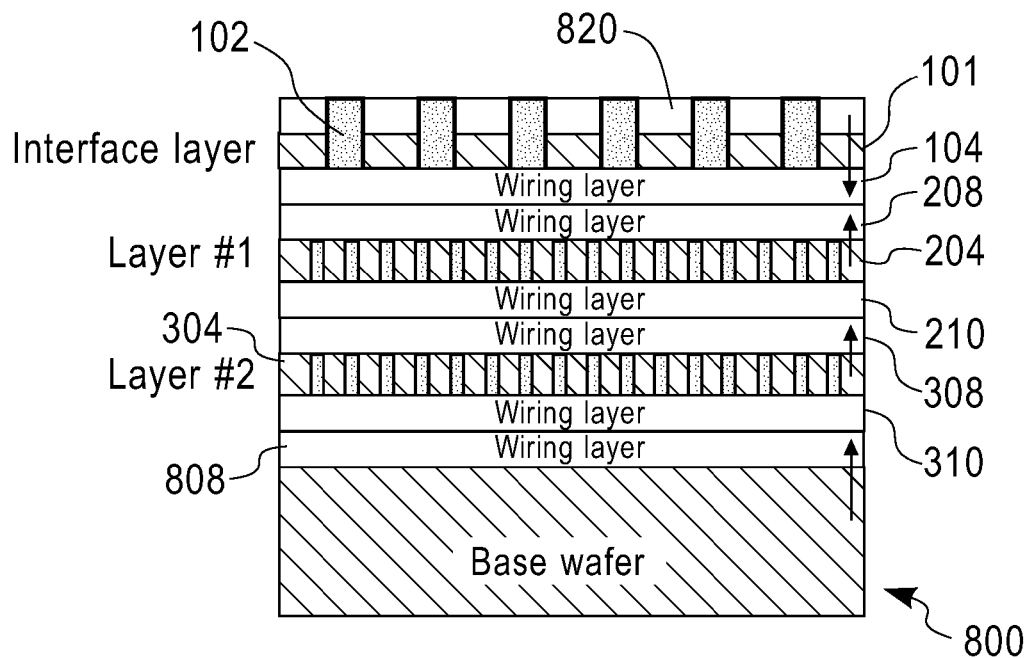

The top wiring layer 310 of the multi-layer stack is then bonded to the base wafer 800. In this embodiment, copper-copper or a combination of copper-copper and adhesive bonding (e.g., using a polymer adhesive) is utilized. In further embodiments, other metallurgies (such as a copper alloy or a nickel-gold alloy) are utilized. The permanent carrier (i.e., interface wafer) is then processed so as to remain as the interface between the stacked layers and the package in the 3D integrated circuit device. In particular, the interface wafer 100 is thinned. In this embodiment, this thinning is achieved in two steps. First, a combination of wafer grinding and polishing are performed to thin the interface wafer to above the vias 102 in the interface wafer 100. Then, the interface wafer 100 is further thinned through a dry etch (e.g., using reactive ion etching) so as to form an interface layer 101 that exposes the top portions of the vias 102, as shown in FIG. 10. A backside dielectric layer 820 is then deposited onto the backside of the interface layer 101.

Figure 11:
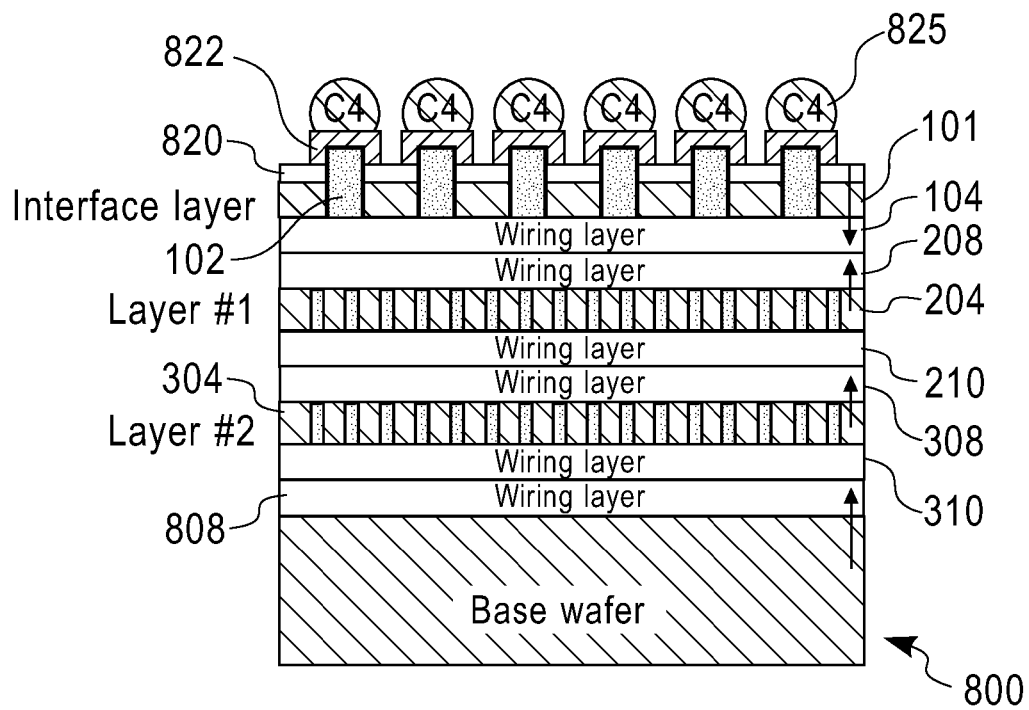

As shown in FIG. 11, the backside dielectric layer 820 is then polished and/or etched, and contact metallizations 822 are deposited onto the vias 102 of the interface layer 101. In this embodiment, a simple ball-limiting metallization is deposited on the vias so as to allow deposition of C4 solder bumps. In other embodiments, more complex dielectric and metallization layers are formed. The C4 solder bumps 825 are then deposited onto the contact metallizations 822 to complete the 3D integrated circuit structure. In this embodiment, the C4 solder bumps are on the order of 100 μm in diameter and 200 μm or less in pitch. These C4 (or flip-chip) solder bumps are then used to bond the integrated circuit to the package (e.g., a resin or ceramic module).

The exemplary process described above is only meant to illustrate the principles of the present invention. By simply varying the number, types, and order of layers that are stacked on the interface wafer, many different 3D integrated circuit structures can be produced. For example, while the exemplary process described above produces a structure having a 1+2+1 stack (1 base wafer, 2 active circuitry layers, and 1 interface layer), a structure having a 1+N+1 stack can be created by simply repeating the active circuitry layer stacking process N times as described above. In the 1+N+1 stack structure, additional active circuitry layers (each analogous to the one formed by layers 210, 204, and 208) are stacked between layer 210 of the first active circuitry layer and layer 308 of the last ($N^{th}$) active circuitry layer in the structure of FIG. 11 (see, for example, FIG. 12).

Similarly, a structure having a 1+1+1 stack can be created by only performing the active circuitry layer stacking process one time. In the 1+1+1 stack structure, the second active circuitry layer (the one formed by layers 310, 304, and 308) is absent from the structure of FIG. 11. Thus, the process of the present invention for stacking multiple active circuitry layers on top of a base wafer can also be used in a consistent manner to stack only one active circuitry layer on a base wafer.

Figure 12:
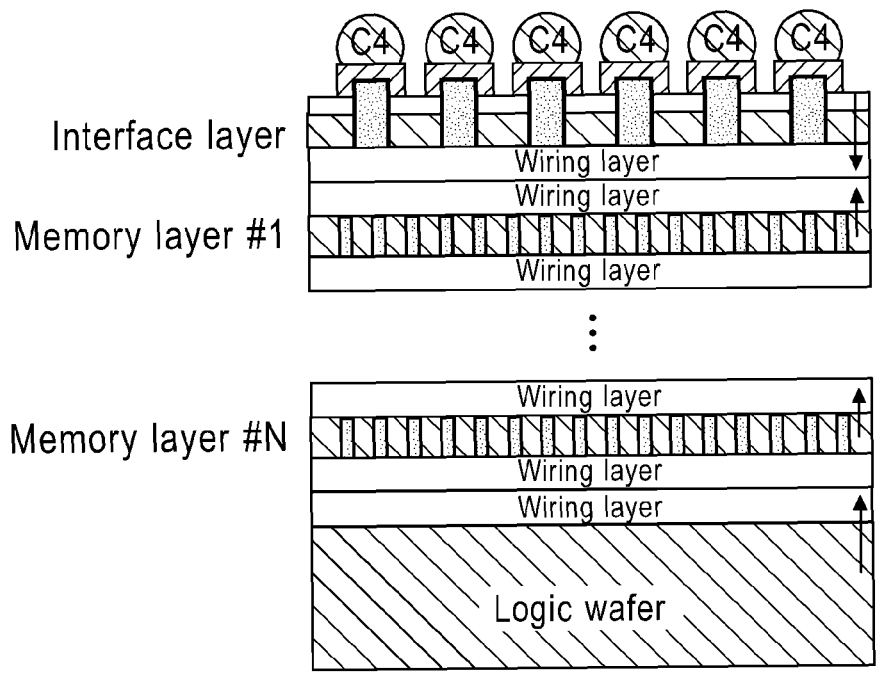
FIG. 12 shows a 3D integrated circuit structure having a logic layer-active circuitry layers-interface layer stack structure according to one embodiment of the present invention.

In further embodiments, a logic wafer (i.e., a wafer with logic circuitry) is used as the base wafer (i.e., the base wafer includes logic circuitry). For example, FIG. 12 shows a 3D integrated circuit structure having a logic wafer-active circuitry layers-interface layer stack structure according to one embodiment of the present invention. This exemplary embodiment has an interface layer that is stacked on top of N active circuitry layers, which are memory layers, that are in turn stacked on top of a logic wafer. The memory layers are any type of memory, such as SRAM memory, e-DRAM memory, or a combination of the two. The logic wafer contains control and/or logic circuitry, such as a memory controller or a processor core.

Accordingly, the lower-cost active circuitry layers are stacked before the higher-cost active circuitry layer. In particular, the 3D integrated circuit device is a controller or processor having an embedded memory. The embedded memory is formed on a stack of multiple (N) active circuitry layers, and the controller or processer is formed on the base wafer. Thus, as shown in FIG. 12, the multiple memory layers that are less expensive to manufacture are all stacked first, and then the stack is attached to the base wafer that contains the higher-cost controller or processor. With this sequence, the logic wafer only needs to go through one bonding and thinning, so the potential for a catastrophic processing failure for the higher-cost layer is reduced. Additionally, this allows for sorting of the memory stack and logic wafers to be combined in the final step, so as to further increase yield.

In another embodiment, the embedded memory is formed as a single active circuitry layer that is stacked on top of the logic wafer. More specifically, this exemplary embodiment has an interface layer that is stacked on top of one active circuitry layer, which is a memory layer, that is in turn stacked on top of a base wafer. The base wafer contains control and/or logic circuitry, such as a memory controller or a processor core. Accordingly, the lower-cost active circuitry layer is stacked before the higher-cost active circuitry layer. Thus, the memory layer that has a lower cost is stacked first, and then attached to the base wafer that contains the higher-cost controller or processor. With this sequence, the logic wafer again only needs to go through one bonding and thinning, so the potential for a catastrophic processing failure for the higher-cost layer is reduced.

In yet another embodiment, the 3D integrated circuit device also includes a separate layer containing a memory controller for the embedded memory. In particular, this exemplary embodiment has an interface layer stacked on top of one or more memory layers, stacked on top of a memory controller layer, stacked on top of a base wafer that contains control and/or logic circuitry (such as a processor core). Thus, the memory controller layer is located between the memory layers and the logic wafer. Accordingly, the lower-cost active circuitry layers are stacked before the higher-cost active circuitry layers.

In another embodiment, the device is a stand-alone 3D memory device that includes a memory controller. In particular, this exemplary embodiment has an interface layer stacked on top of one or more memory layers, stacked on top of a base wafer that contains a memory controller. Accordingly, the lower-cost active circuitry layers are stacked before the higher-cost active circuitry layers. Thus, the one or more memory layers that have a lower cost are stacked first, and then attached to the base wafer that contains the higher cost memory controller. With this sequence, the memory controller layer only needs to go through one bonding and thinning, so the potential for a catastrophic processing failure for the higher-cost layer is reduced.

In further embodiments, the base wafer is not a logic wafer. In such embodiments, the logic is formed on one or more additional active circuitry layers of the stack. In particular, the 3D integrated circuit device has an interface layer stacked on top of one or more memory layers, stacked on top of one or more logic layers, stacked on top of a base wafer. The one or more logic layers comprise a memory controller layer and/or a processor layer. Accordingly, the lower-cost active circuitry layers are stacked before the higher-cost active circuitry layers. Thus, the one or more memory layers that have a lower cost are stacked first, and then attached to the higher-cost memory controller layer and/or processor layer.

Figure 13:
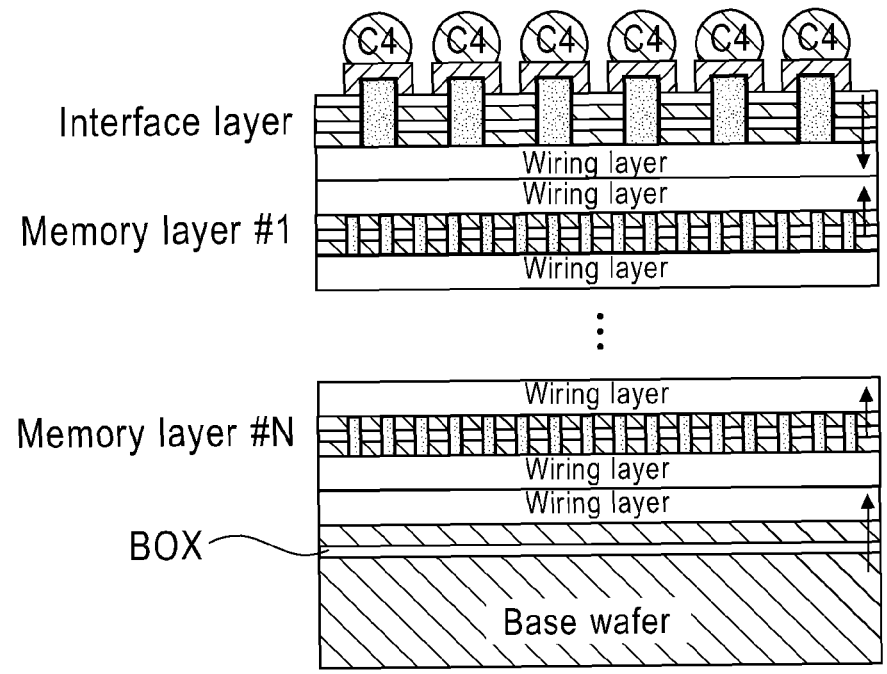
FIG. 13 shows a 3D integrated circuit structure in which all of the layers are SOI wafers in accordance with one embodiment of the present invention.

Additionally, one or more of the wafers used in the process described above can be a silicon-on-insulator (SOI) wafer. For example, FIG. 13 shows a 3D integrated circuit structure in which all of the layers are formed on SOI wafers in accordance with one embodiment of the present invention. In an alternative embodiment, the base wafer is an SOI substrate (as in FIG. 13), while the wafers for the active circuitry layers and the interface layer are bulk silicon wafers (as in FIG. 12). This is particularly useful for a configuration in which the upper layers are memory layers and the base wafer is a logic wafer (e.g., containing a memory controller or processor core). In yet another embodiment, the base wafer is an SOI substrate (as in FIG. 13), the wafers for the active circuitry layers include both an SOI wafer (as in FIG. 13) and a bulk silicon wafer (as in FIG. 12), and the wafer for the interface layer is either an SOI or bulk silicon wafer. This is particularly useful for a configuration in which the upper layers include memory layers formed on bulk silicon wafers and a memory controller layer formed on an SOI wafer, and the base wafer is an SOI logic wafer (e.g., containing a processor core).

Further, multiple technologies can be used to fabricate the individual wafers. For example, in one embodiment the interface wafer is fabricated using a particular CMOS technology (e.g., 22 nm technology), while the other wafers are fabricated using a back-generation CMOS technology (e.g., 32 nm or 45 nm technology).

Figure 14:
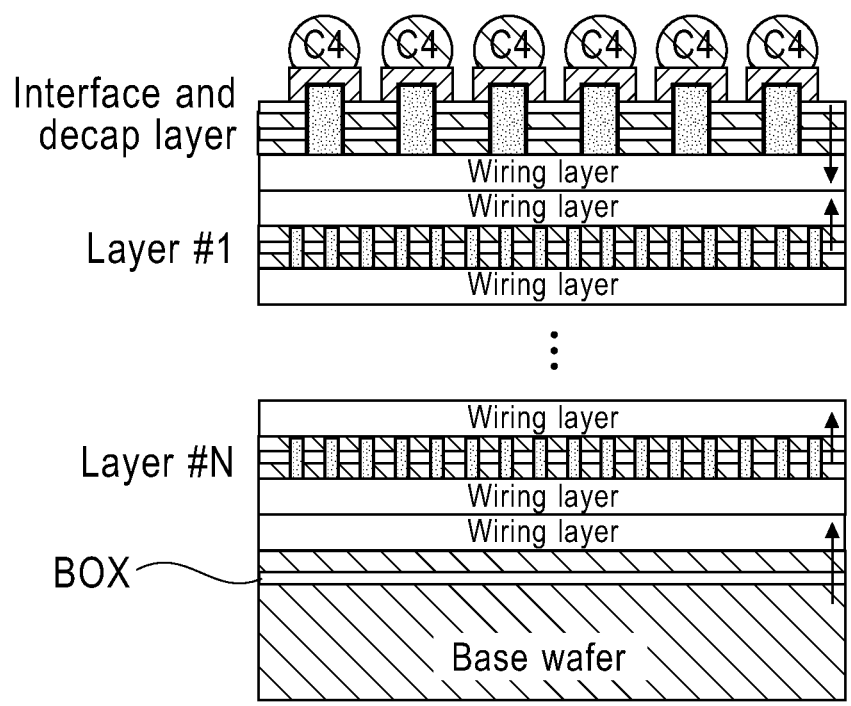
FIG. 14 shows a 3D integrated circuit structure having circuit elements in the interface layer of the stack structure according to one embodiment of the present invention.

FIG. 14 shows a 3D integrated circuit structure having circuit elements in the interface layer of the stack structure according to one embodiment of the present invention. In this embodiment, the interface layer includes additional functionality through the provision of active circuitry and/or passive circuit elements. For example, the interface layer can include a decoupling capacitor layer in order to stabilize the voltage grid. Alternatively or additionally, the interface layer can include voltage regulation circuitry formed by active transistors as well as passive elements such as decoupling capacitors.

Accordingly, embodiments of the present invention stack lower-cost active circuitry layers before one or more higher-cost active circuitry layers during 3D integrated circuit device fabrication. Lower-cost active circuitry layers are less expensive to manufacture than higher-cost active circuitry layers. Because the lower-cost layers are stacked before the higher-cost layer, the risk of damage to the higher-cost layer during assembly is reduced. Thus, the present invention improves yield for 3D integrated circuit devices, and lowers manufacturing cost.

The embodiments of the present invention described above are meant to be illustrative of the principles of the present invention. These device fabrication processes are compatible with conventional semiconductor fabrication methodology, and thus various modifications and adaptations can be made by one of ordinary skill in the art. All such modifications still fall within the scope of the present invention. For example, the various layer thicknesses, material types, deposition techniques, and the like discussed above are not meant to be limiting.

Furthermore, some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Figure 15:
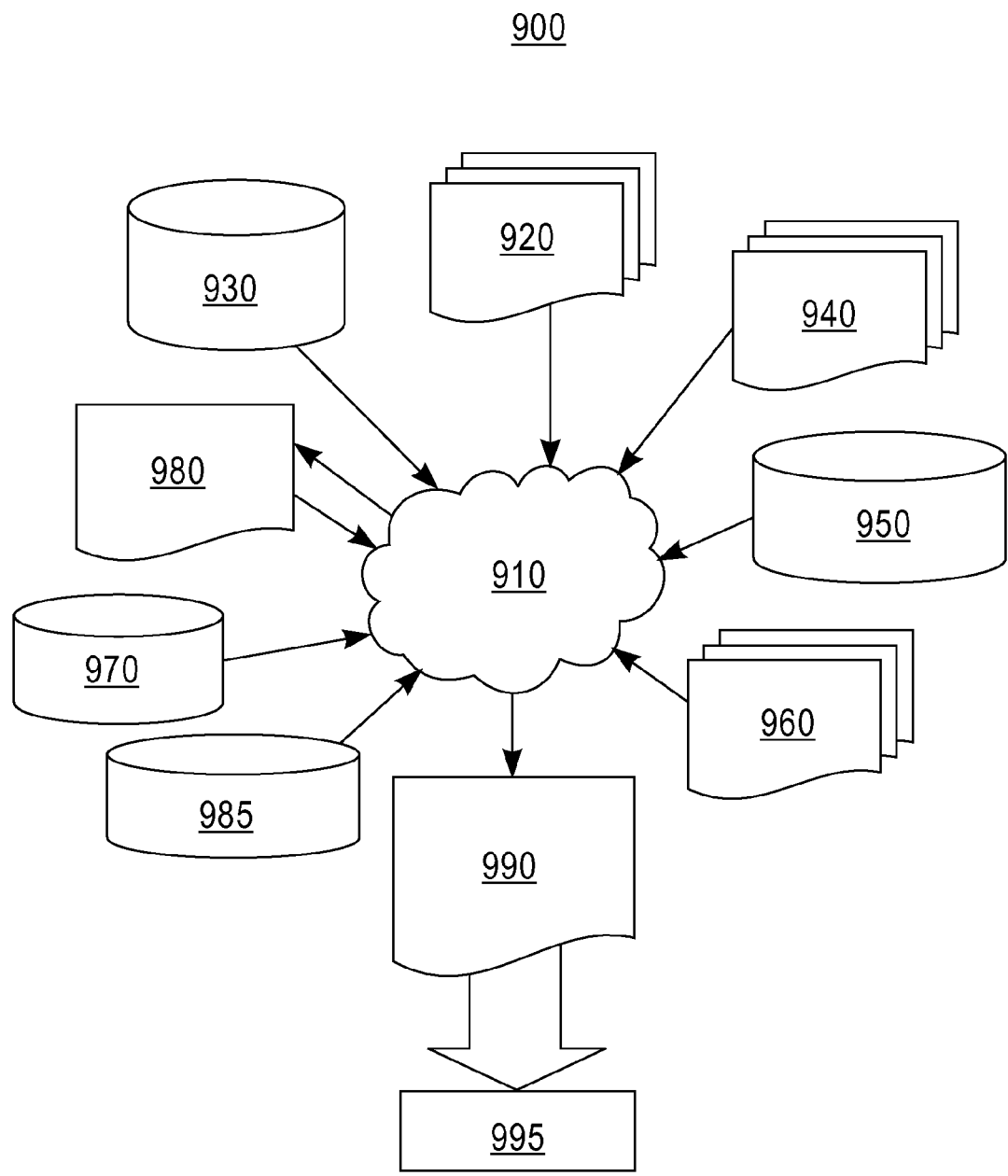
FIG. 15 is a flow diagram of a design process used in semiconductor design, manufacture, and/or test.

FIG. 15 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g., information stored in a ICES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

What is claimed is:

1. A 3D integrated circuit structure comprising:
an interface wafer, the interface wafer including a first wiring layer on one side of the interface wafer, an interface layer on the other side of the interface wafer, and through-silicon vias;
a first active circuitry layer including active circuitry and a second wiring layer, the first active circuitry layer being bonded face down to the interface wafer, the second wiring layer of the first active circuitry layer being directly bonded to the first wiring layer of the interface wafer; and
an additional wafer including active circuitry and a third wiring layer, a stack structure being bonded face down to the additional wafer, the stack structure including the interface wafer and the first active circuitry layer,
wherein the first active circuitry layer is less expensive to manufacture relative to the additional wafer.

2. The 3D integrated circuit structure of claim 1, wherein the additional wafer is an a second active circuitry layer wafer and the third wiring layer of the second active circuitry layer wafer is directly bonded to the first active circuitry layer.

3. The 3D integrated circuit structure of claim 1, wherein the additional wafer is an SOI wafer.

4. The 3D integrated circuit structure of claim 1, wherein the first active circuitry layer is a memory layer comprising embedded memory, and the additional wafer comprises a logic layer.

5. The 3D integrated circuit structure of claim 4, wherein the logic layer comprises at least one of a memory controller and a microprocessor core.

6. The 3D integrated circuit structure of claim 1, further comprising:
metallization comprising solder bumps located on the interface layer of the interface wafer, the metallizations being coupled through the through-silicon vias of the interface layer to the first wiring layer.

7. The 3D integrated circuit structure of claim 2, further comprising:
a base wafer including a fourth wiring layer,
wherein the stack structure further includes N additional active circuitry layers, N being an integer that is greater than or equal to one, and
the additional wafer is directly bonded to the fourth wiring layer of the base wafer.

8. The 3D integrated circuit structure of claim 7, wherein the first active circuitry layer is a memory layer comprising embedded memory, the additional wafer is a memory layer comprising embedded memory, and the base wafer is a logic layer comprising at least one of a memory controller and a microprocessor core.

9. The 3D integrated circuit structure of claim 2, further comprising:
a base wafer including a fourth wiring layer,
wherein the interface wafer, the first active circuitry layer, and the additional wafer are bonded face down to the base wafer.

10. The 3D integrated circuit structure of claim 1, wherein the third wiring layer of the additional wafer is directly bonded to the second wiring layer of the first active circuitry layer.

11. The 3D integrated circuit structure of claim 1,
wherein the additional wafer is a base wafer, and
the first active circuitry layer is bonded face down to the base wafer.

12. The 3D integrated circuit structure of claim 1,
wherein the stack structure further includes another active circuitry layer that includes active circuitry, the other active circuitry layer being bonded face down above the interface wafer and the first active circuitry layer, and
the additional wafer is a base wafer.

13. The 3D integrated circuit structure of claim 12, wherein the stack structure further includes N additional active circuitry layers, N being an integer that is greater than or equal to one.

14. The 3D integrated circuit structure of claim 4, wherein the memory layer comprises embedded DRAM, and the logic layer comprises a microprocessor core.

15. The 3D integrated circuit structure of claim 4, wherein the memory layer comprises at least one of embedded DRAM and SRAM, and the logic layer comprises a memory controller.

16. A 3D integrated circuit structure comprising:
an interface wafer, the interface wafer including a first wiring layer on one side of the interface wafer, an interface layer on the other side of the interface wafer, and through-silicon vias;

N first active circuitry layers each including active circuitry and through-silicon vias, one of the first active circuitry layers being bonded face down to the interface wafer, a wiring layer of the one first active circuitry layer being directly bonded to the first wiring layer of the interface wafer, and each of the other N first active circuitry layers being bonded face down to another of the first active circuitry layers above the interface wafer, so as to form a circuit layer stack above the interface wafer;

a second active circuitry layer including active circuitry and a third wiring layer, the third wiring layer of the second active circuitry layer being bonded directly to one of the wiring layers of the circuit layer stack; and, metallizations comprising solder bumps located on the interface layer, the metallizations being coupled through the through-silicon vias of the interface layer to the first wiring layer, wherein each of the N first active circuitry layers is less expensive to manufacture relative to the second active circuitry layer, and N is an integer that is greater than or equal to one.

17. The 3D integrated circuit structure of claim 16, further comprising:

a base wafer including a fourth wiring layer, wherein the second active circuitry layer is bonded to a top of the circuit layer stack and to the fourth wiring layer of the base wafer.

18. The 3D integrated circuit structure of claim 17, wherein each of the N first active circuitry layers is a memory layer comprising embedded memory, and the second active circuitry layer is a logic layer comprising at least one of a memory controller and a microprocessor core.

19. The 3D integrated circuit structure of claim 17, wherein the second active circuitry layer has the same length and width as each of the N first active circuitry layers.

20. The 3D integrated circuit structure of claim 16, wherein the second active circuitry layer is a base wafer that includes the second active circuitry layer, and the circuit layer stack is bonded face down to the base wafer.

\* \* \* \* \*